(12) United States Patent
Tzeng et al.

(10) Patent No.: US 7,279,869 B2
(45) Date of Patent: Oct. 9, 2007

(54) PFM CONTROL CIRCUIT FOR DC REGULATOR

(75) Inventors: Guang-Nan Tzeng, Hsinchu (TW); Yung-Chih Chen, Pingtung County (TW); Ya-Der Tain, Taipei County (TW)

(73) Assignee: Aimtron Technology Corp., Hsinchu (TW)

( * ) Notice: Subject to any disclaimer, the term of this patent is extended or adjusted under 35 U.S.C. 154(b) by 153 days.

(21) Appl. No.: 10/908,303

(22) Filed: May 6, 2005

(65) Prior Publication Data

US 2006/0250121 A1 Nov. 9, 2006

(51) Int. Cl.
*G05F 1/10* (2006.01)

(52) U.S. Cl. ............... 323/222; 323/283; 323/288; 323/285

(58) Field of Classification Search ........... 323/222, 323/283, 288, 285
See application file for complete search history.

(56) References Cited

U.S. PATENT DOCUMENTS

| | | | |
|---|---|---|---|
| 5,481,178 A | 1/1996 | Wilcox et al. | |
| 5,568,044 A | 10/1996 | Bittner | |
| 5,747,976 A | 5/1998 | Wong et al. | |
| 5,801,518 A | 9/1998 | Ozaki et al. | |
| 5,949,226 A | 9/1999 | Tanaka et al. | |
| 6,486,645 B1 | 11/2002 | Van Auken | |
| 6,545,882 B2 | 4/2003 | Yang | |
| 6,791,368 B2 | 9/2004 | Tzeng et al. | |
| 6,801,024 B2 * | 10/2004 | Bernardon | 323/224 |

* cited by examiner

*Primary Examiner*—Shawn Riley
(74) *Attorney, Agent, or Firm*—Winston Hsu (57) ABSTRACT

A PFM control circuit generates a pulse control signal for controlling a switching regulator to convert an input voltage into an output voltage. The pulse control signal has a plurality of switch cycles, each of which consists of an ON-time and an OFF-time. The ON-time is applied to turn on a switching circuit of the switching regulator while the OFF-time is applied to turn off the switching circuit. A current detection signal is representative of a current flowing through an inductive device of the switching regulator. The ON-time is prolonged in accordance with an increase of a maximum of the current detection signal. A voltage detection signal is representative of the output voltage. The OFF-time is prolonged in accordance with a reduction of a falling rate of the voltage detection signal.

10 Claims, 4 Drawing Sheets

PFM CONTROL CIRCUIT FOR DC REGULATOR

BACKGROUND OF INVENTION

1. Field of the Invention

The present invention relates to a pulse frequency modulation (PFM) control circuit and, more particularly, to a PFM control circuit for converting voltages with high efficiency over broad loading requirements.

2. Description of the Related Art

For providing electronics devices with a stable power supply so as to ensure steady performance, voltage regulators are indispensable components. The voltage regulator supplies a required amount of current to a load at a regulated output voltage. Therefore, when the electronics devices are used as the loads with respect to the voltage regulators, the performance of the electronics devices is kept stable and prevented from being affected by fluctuations of the power supply. In addition to the regulation of the power supply, the lifetime of the power supply is also an important issue to be considered for a variety of portable electronics devices powered by isolated and finite sources such as batteries.

In terms of the efficiency of voltage conversion, linear voltage regulators due to power loss caused by passive regulating transistors are inferior to switching voltage regulators. The switching voltage regulator typically includes a control circuit for turning on and off a switching circuit. Through appropriately control the duty ratio of the switching circuit, i.e. a ratio of an ON-time of the switching circuit to a period of a switch cycle, the output voltage is regulated to a desired level for supplying current required by the load. In prior art are there many well-known control circuits and methods, such as a pulse width modulation (PWM) mode, a constant ON-time PFM mode, and a constant OFF-time PFM mode. However, the conventional control circuits and methods achieve a high efficiency of voltage conversion only within a limited range of loading requirements. For example, the PWM mode provides a preferred efficiency in a heavy loading operation, the constant ON-time PFM mode in a light loading operation, and the constant OFF-time PFM mode in a heavy loading operation. In order to convert voltages with high efficiency both in heavy and light loading operations, it has been suggested that an automatic selection be made between the PWM mode and the PFM mode depending on the magnitude of the loading requirement. However, such a solution must combine two different kinds of control circuits into the same integrated circuit chip as well as a specially-designed mode selection circuit, resulting in complicated circuitry and a higher cost.

Therefore, it is desirable to develop a control circuit and method of converting voltages with high efficiency over broad loading requirements.

SUMMARY OF THE INVENTION

In view of the above-mentioned problems, an object of the present invention is to provide a PFM control circuit capable of converting voltages with high efficiency over broad loading requirements.

According to one aspect of the present invention, a pulse frequency modulation control circuit is provided for controlling a switching regulator to convert an input voltage to an output voltage. The switching regulator has a switching circuit and an inductive device. The pulse frequency modulation control circuit includes a current sensing circuit, a voltage sensing circuit, and a pulse generating circuit. The current sensing circuit generates a current detection signal representative of a current flowing through the inductive device. The voltage sensing circuit generates a voltage detection signal representative of the output voltage. In response to the current detection signal and the voltage detection signal, the pulse generating circuit generates a pulse control signal. The pulse control signal has a plurality of switch cycles, each of which consists of an ON-time and an OFF-time. The ON-time is applied to turn on the switching circuit while the OFF-time is applied to turn off the switching circuit.

The ON-time is adjusted in accordance with the current detection signal such that the ON-time is prolonged in response to an increase of a maximum of the current detection signal. Therefore, the necessary number of the switch cycles is prevented from increasing in a heavy loading operation, resulting in an improvement of the efficiency in voltage conversion. The OFF-time is adjusted in accordance with the voltage detection signal such that the OFF-time is prolonged in response to a reduction of a falling rate of the voltage detection signal. Therefore, the necessary number of the switch cycles is prevented from increasing in a light loading operation, resulting in an improvement of the efficiency in voltage conversion.

According to another aspect of the present invention, a pulse frequency modulation method is provided for controlling a switching regulator to convert an input voltage to an output voltage. The switching regulator has a switching circuit and an inductive device. The pulse frequency modulation control method has a plurality of switch cycles. Each switch cycle includes: a step of providing an ON-time for being applied to turn on the switching circuit, and a step of providing an OFF-time for being applied to turn off the switching circuit. The ON-time during a present switch cycle is dynamically adjusted in accordance with a maximum of a current flowing through the inductive device during a previous switch cycle. The OFF-time during a present switch cycle is dynamically adjusted in accordance with a falling rate of the output voltage during the present switch cycle.

BRIEF DESCRIPTION OF THE DRAWINGS

The above-mentioned and other objects, features, and advantages of the present invention will become apparent with reference to the following descriptions and accompanying drawings, wherein.

DETAILED DESCRIPTION OF THE PREFERRED EMBODIMENTS

The preferred embodiments according to the present invention will be described in detail with reference to the drawings.

Figure 1:
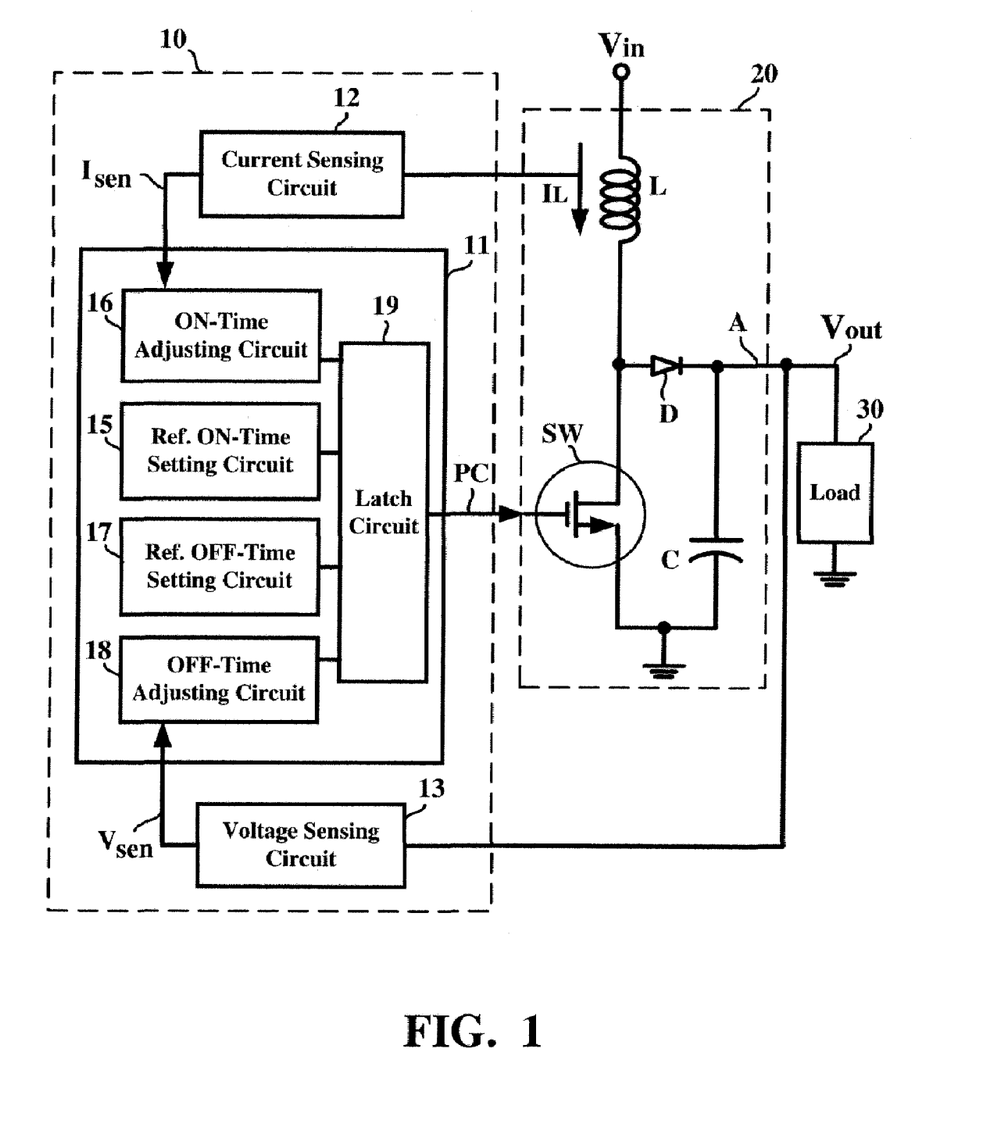
FIG. 1 is a circuit block diagram showing a PFM control circuit according to the present invention.

FIG. 1 is a circuit block diagram showing a PFM control circuit according to the present invention. Referring to FIG. 1, under control of a PFM control circuit 10, a switching regulator 20 is able to convert a susceptible input voltage $V_{in}$ into a regulated output voltage $V_{out}$ and supply a current required by a load 30 through an output terminal A. It should be noted that although the switching regulator 20 shown in FIG. 1 has a boost topology, the present invention is not limited to this and may be applied to a buck topology or any other topologies. Moreover, although the switching regulator 20 shown in FIG. 1 has a non-synchronous switching circuit consisting of a switching transistor SW and a diode D, the present invention is not limited to this and may be applied to a synchronous switching circuit consisting of two switching transistors.

The PFM control circuit 10 includes a pulse generating circuit 11, a current sensing circuit 12, and a voltage sensing circuit 13. The pulse generating circuit 11 outputs a pulse control signal PC for controlling the switching transistor SW of the switching regulator 20. The pulse control signal PC is formed of a plurality of switch cycles, one by one consecutively associated with each other. Each of the switch cycles has a first level state and a second level state. The first level state is applied to turn on the switching transistor SW, which is hereinafter referred to as an ON-time, while the second level state is applied to turn off the switching transistor SW, which is hereinafter referred to as an OFF-time. The current sensing circuit 12 generates a current detection signal $I_{sen}$ representative of an inductive current $I_L$ flowing through an inductive device L. The voltage sensing circuit 13 generates a voltage detection signal $V_{sen}$ representative of the output voltage $V_{out}$. In response to the current detection signal $I_{sen}$ and the voltage detection signal $V_{sen}$, the pulse generating circuit 11 dynamically adjusts the ON-time and the OFF-time of the pulse control signal PC each switch cycle, thereby effectively converting voltages with high efficiency over broad loading requirements.

In one embodiment, the current sensing circuit 12 may be implemented by a series-connected resistor, across which a potential difference caused by the inductive current $I_L$ serves as the current detection signal $I_{sen}$. In another embodiment, the current sensing circuit 12 may be implemented in accordance with U.S. Pat. No. 6,791,368, entitled "Current Sensing Circuit And Method Of A High-Speed Driving Stage," issued to the assignee of the present application, which is fully incorporated herein by reference. In one embodiment, the voltage sensing circuit 13 may be implemented by a resistive voltage divider, coupled between the output terminal A of the switching regulator 20 and a ground potential, for providing a division of the output voltage $V_{out}$ as the voltage detection signal $V_{sen}$. Further descriptions would be omitted since the current sensing circuit 12 and the voltage sensing circuit 13 are well known by one skilled in the art.

The pulse generating circuit 11 includes a reference ON-time setting circuit 15, an ON-time adjusting circuit 16, a reference OFF-time setting circuit 17, an OFF-time adjusting circuit 18, and a latch circuit 19. The reference ON-time setting circuit 15 provides a predetermined reference ON-time to serve as a lower limit of a practically-applied ON-time every switch cycle. Based on the current detection signal $I_{sen}$ of the current sensing circuit 12, the ON-time adjusting circuit 16 dynamically adjusts the practically-applied ON-time every switch cycle. More specifically, the practically-applied ON-time is prolonged in response to an increase of a maximum of the current detection signal $I_{sen}$, thereby improving the voltage converting efficiency in the heavy loading operation. The reference OFF-time setting circuit 17 provides a predetermined reference OFF-time to serve as a lower limit of a practically-applied OFF-time every switch cycle. Based on the voltage detection signal $V_{sen}$ of the voltage sensing circuit 13, the OFF-time adjusting circuit 18 dynamically adjusts the practically-applied OFF-time every switch cycle. More specifically, the practically-applied OFF-time is prolonged in response to a reduction of a falling rate of the voltage detection signal $V_{sen}$, thereby improving the voltage converting efficiency in the light loading operation. Under the triggers of the practically-applied ON-time and OFF-time, the latch circuit 19 generates the pulse control signal PC for controlling the switching transistor SW of the switching regulator 20.

Figure 2:
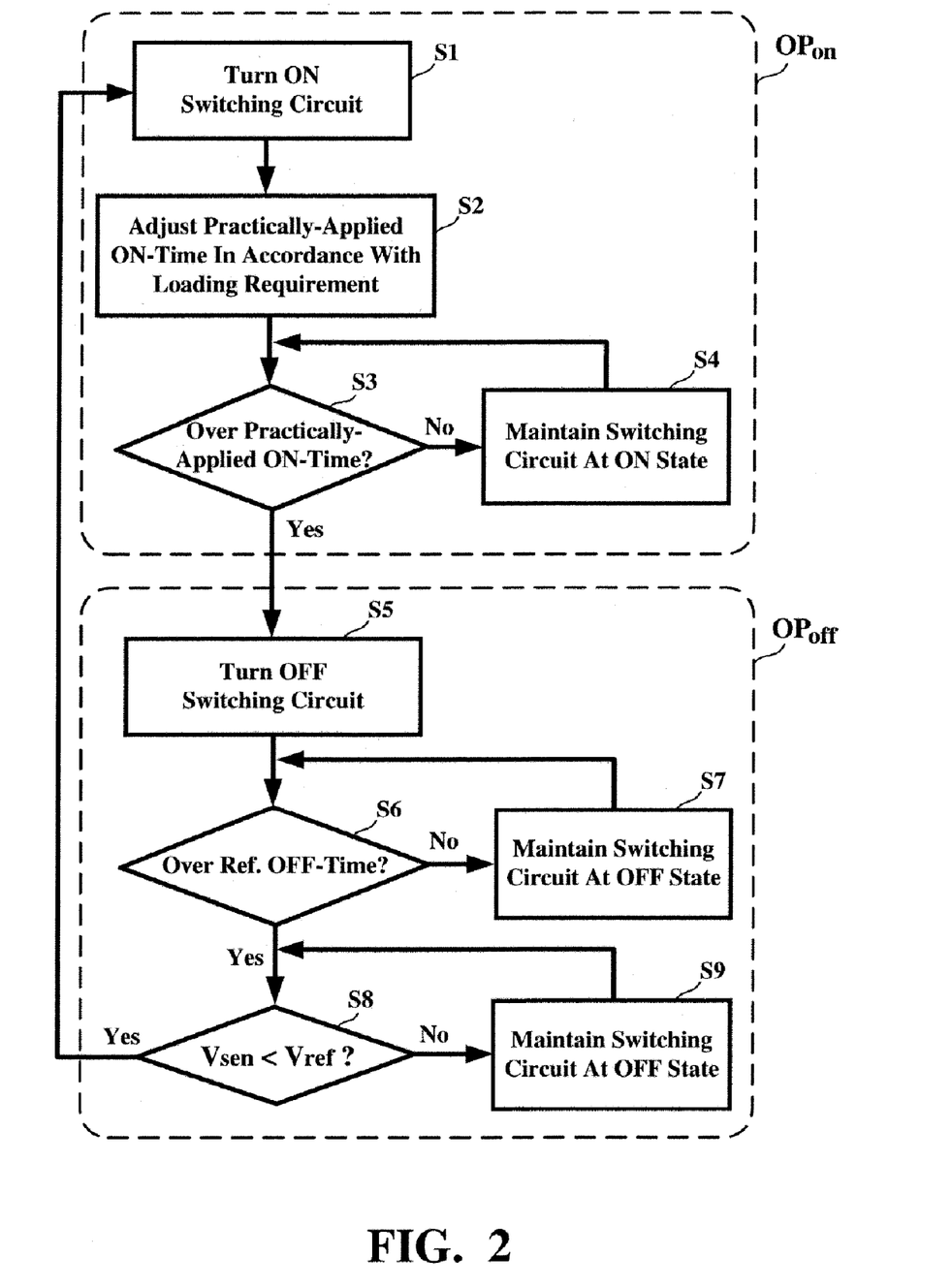
FIG. 2 is a flow chart showing a PFM control method according to the present invention.

FIG. 2 is a flow chart showing a PFM control method according to the present invention. Referring to FIG. 2, the PFM control method according to the present invention includes an ON-time operation period $OP_{on}$ and an OFF-time operation period $OP_{off}$, both of which together form a switch cycle. During the ON-time operation period $OP_{on}$, the switching transistor SW of the switching regulator 20 is turned on such that energy from the input voltage $V_{in}$ is supplied to the inductive device L, causing the inductive current $I_L$ to flow and gradually rise. During the OFF-time operation period $OP_{off}$, the switching transistor SW of the switching regulator 20 is turned off such that the energy stored in the inductive device L is delivered to the load 30, causing the inductive current $I_L$ to gradually fall.

In a step S1, the switching transistor SW is turned on to initiate a new ON-time operation period $OP_{on}$. In a step S2, the inductive current $I_L$ is detected so as to obtain information about the loading requirement. The practically-applied ON-time is dynamically adjusted in accordance with the current detection signal $I_{sen}$ indicative of the loading requirement. In a step S3, it is determined whether the switching transistor SW has been maintained at the conductive state for the practically-applied ON-time or not. If no, then the switching transistor SW is still maintained at the conductive state in a step S4. As soon as the switching transistor SW has been maintained at the conductive state for the practically-applied ON-time, the switching transistor SW is turned off in a step S5. In other words, the ON-time operation period $OP_{on}$ is finished and an OFF-time operation period $OP_{off}$ is initiated. In a step S6, it is determined whether the switching transistor SW has been maintained at the non-conductive state for the predetermined reference OFF-time or not. If no, then the switching transistor SW is still maintained at the non-conductive state in a step S7. As soon as the switching transistor SW has been maintained at the non-conductive state for the predetermined reference OFF-time, it is further determined whether the voltage detection signal $V_{sen}$ representative of the output voltage $V_{out}$ has fallen below a predetermined reference voltage $V_{ref}$ or not in a step S8. If no, then the switching transistor SW is still maintained at the non-conductive state in a step S9. As soon as the voltage detection signal $V_{sen}$ falls below the reference voltage $V_{ref}$, the switching transistor SW is turned on again, back to the step S1. In other words, the OFF-time operation period $OP_{off}$ is finished and a new ON-time operation period $OP_{off}$ of a next switch cycle is initiated.

Figure 3:
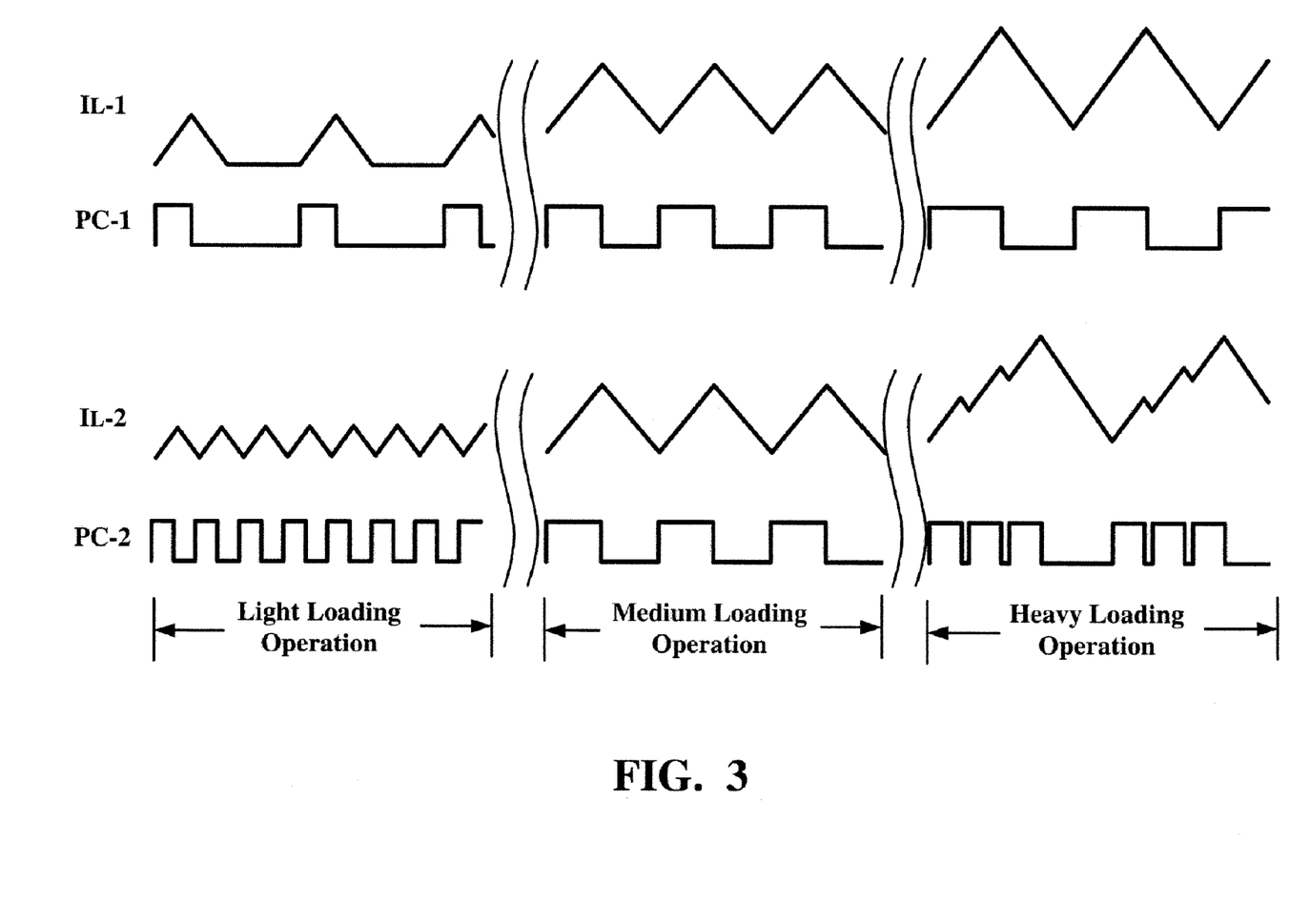
FIG. 3 is a waveform timing chart showing operations of a PFM voltage regulator according to the present invention.

FIG. 3 is a waveform timing chart showing operations of a PFM voltage regulator according to the present invention. A curve $I_L$-1 illustrates a waveform of an inductive current according to the present invention in a light loading operation, a medium loading operation, and a heavy loading operation. A curve PC-1 illustrates a waveform of a pulse control signal according to the present invention in a light loading operation, a medium loading operation, and a heavy loading operation. For appropriate appreciation of the high efficiency over broad loading requirements achieved according to the present invention, waveforms of a conventional PFM voltage regulator are also illustrated in FIG. 3 for the sake of comparison. A curve $I_L$-2 illustrates a waveform of a prior art inductive current in a light loading operation, a medium loading operation, and a heavy loading operation. A curve PC-2 illustrates a waveform of a prior art pulse control signal in a light loading operation, a medium loading operation, and a heavy loading operation.

In the heavy loading operation, an average of the inductive current $I_L$-1 should be elevated to a higher value so as to satisfy the requirement of a larger loading current. Since the practically-applied ON-time of the pulse control signal PC-1 is dynamically adjusted in accordance with the loading requirement, the practically-applied ON-time according to the present invention is prolonged in the heavy loading operation such that the inductive current $I_L$-1 is allowed to reach a higher value during a single switch cycle. As a result, the necessary number of the switch cycles of the pulse control signal PC-1 according to the present invention is effectively prevented from increasing in the heavy loading operation. To the contrary, the prior art constant ON-time PFM mode has a lower efficiency caused by a relatively large number of the switch cycles of the pulse control signal PC-2 since the prior art ON-time fails to be adjusted in accordance with the loading requirement.

In the light loading operation, the output voltage $V_{out}$ falls with a relatively slow rate during the OFF-time due to a small requirement for the loading current. Since the practically-applied OFF-time is dynamically adjusted in accordance with the determination of the voltage detection signal $V_{sen}$ falling below the reference voltage $V_{ref}$, the practically-applied OFF-time is prolonged from the reference OFF-time in the light loading operation. As a result, the necessary number of the switch cycles of the pulse control signal PC-1 according to the present invention is effectively prevented from increasing in the light loading operation. To the contrary, the prior art constant OFF-time PFM mode has a lower efficiency caused by a relatively large number of the switch cycles of the pulse control signal PC-2 since the prior art OFF-time fails to be adjusted in accordance with the loading requirement.

Figure 4:
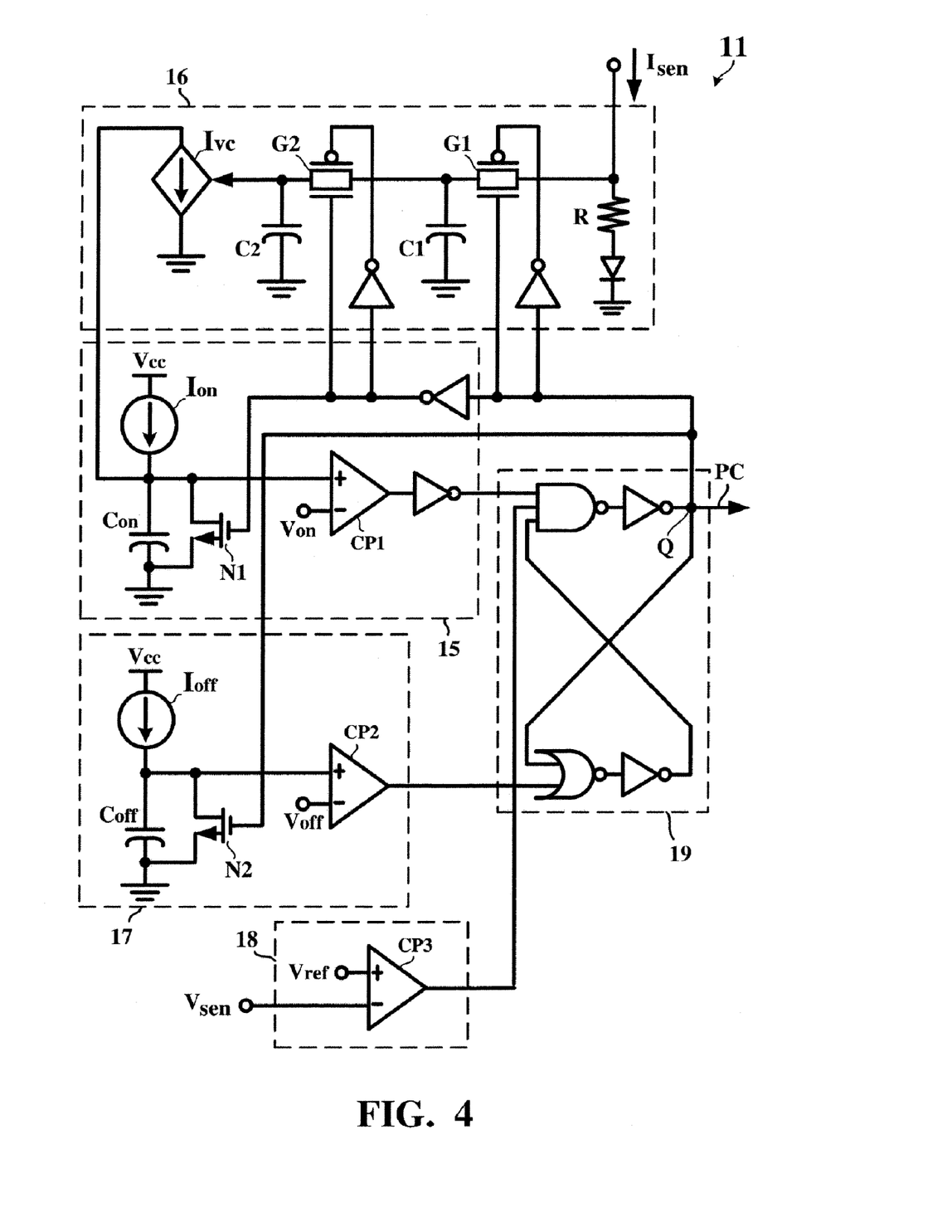
FIG. 4 is a detailed circuit diagram showing one example of a pulse generating circuit according to the present invention.

FIG. 4 is a detailed circuit diagram showing one example of a pulse generating circuit 11 according to the present invention. The latch circuit 19 has an output terminal Q for supplying the pulse control signal PC. Now assumed that the voltage detection signal $V_{sen}$ is lower than the reference voltage $V_{ref}$, a new ON-time operation period $OP_{on}$ is initiated. That is, a high voltage level is asserted at the output terminal Q of the latch circuit 19 for turning on the switching transistor SW of the switching regulator 20. On the other hand, the high voltage level at the output terminal Q of the latch circuit 19 is inverted to become a low voltage level for turning off a switch N1 of the reference ON-time setting circuit 15, thereby causing a reference current source $I_{on}$ to start charging a capacitor $C_{on}$. At the same time, a voltage-controlled variable current source $I_{vc}$ of the ON-time adjusting circuit 16 is used to discharge the capacitor $C_{on}$. Under such a circumstance, a rising rate of a potential difference across the capacitor $C_{on}$ is slowed down because of the sinking from the variable current source $I_{vc}$. The larger the variable current source $I_{vc}$, the later in time the potential difference across the capacitor $C_{on}$ reaches a predetermined reference voltage $V_{on}$. As a result, a comparator CP1 is triggered at a later time than that when otherwise only the reference current source $I_{on}$ is allowed to charge. That is, an effect on prolonging the practically-applied ON-time is achieved by the ON-time adjusting circuit 16. When the potential difference across the capacitor $C_{on}$ reaches the reference voltage $V_{on}$, the comparator CP1 is triggered such that the high voltage level asserted at the output terminal Q of the latch circuit 19 is changed to a low voltage level. To sum up, the practically-applied ON-time during which the high voltage level is asserted at the output terminal Q of the latch circuit 19 is dynamically adjusted by the ON-time adjusting circuit 16 in accordance with the current detection signal $I_{sen}$.

As clearly seen from careful observations, the current detection signal $I_{sen}$ is such an oscillating waveform that increases during the ON-time operation period $OP_{on}$ and decreases during the OFF-time operation period $OP_{off}$. Consequently, in the embodiment shown in FIG. 4, the ON-time adjusting circuit 16 employs a sample-and-hold circuit for sampling a maximum of the current detection signal $I_{sen}$ during a previous switch cycle, and then holding it as a control voltage for the variable current source $I_{vc}$ to dynamically adjust the practically-applied ON-time during the present switch cycle. More specifically, during the ON-time operation period $OP_{on}$, the high voltage level at the output terminal Q of the latch circuit 19 turns on a transmission gate G1 and turns off a transmission gate G2, thereby allowing a capacitor C1 to retrieve a maximum of the current detection signal $I_{sen}$ immediately before the ON-time is finished. Subsequently during the OFF-time operation period $OP_{off}$ of the same switch cycle, the low voltage level at the output terminal Q of the latch circuit 19 turns off the transmission gate G1 and turns on the transmission gate G2, thereby transferring the maximum sampled on the capacitor C1 to a capacitor C2 and holding it thereon. When an ON-time operation period $OP_{on}$ of a next switch cycle is initiated, the maximum held on the capacitor C2 is utilized to control the variable current source $I_{vc}$ for dynamically adjusting the practically-applied ON-time.

After the OFF-time operation period $OP_{off}$ is initiated, a low voltage level at the output terminal Q of the latch circuit 19 turns off the switching transistor SW of the switching regulator 20 and also turns off a switch N2 of the reference OFF-time setting circuit 17, thereby causing a reference current source $I_{off}$ to start charging a capacitor $C_{off}$. When a potential difference across the capacitor $C_{off}$ reaches a predetermined reference voltage $V_{off}$, a comparator CP2 is triggered to notify the latch circuit 19 that a reference OFF-time has been past so far. However, the output terminal Q of the latch circuit 19 is not guaranteed to change from a low voltage level to a high voltage level simply because the comparator CP2 is triggered since the operation of the OFF-time adjusting circuit 18 should also be taken into consideration. More specifically, the OFF-time adjusting circuit 18 is implemented by a comparator CP3 for comparing the voltage detection signal $V_{sen}$ and the reference voltage $V_{ref}$. When the voltage detection signal $V_{sen}$ is lower than the reference voltage $V_{ref}$, the comparator CP3 is triggered such that the output terminal Q of the latch circuit 19 is changed to a high voltage level. To sum up, the practically-applied OFF-time during which the low voltage level is asserted at the output terminal Q of the latch circuit 19 is dynamically adjusted by the OFF-time adjusting circuit 18 in accordance with the voltage detection signal $V_{sen}$.

While the invention has been described by way of examples and in terms of preferred embodiments, it is to be understood that the invention is not limited to the disclosed embodiments. To the contrary, it is intended to cover various modifications. Therefore, the scope of the appended claims should be accorded the broadest interpretation so as to encompass all such modifications.

What is claimed is:

1. A pulse frequency modulation control circuit for controlling a switching regulator having a switching circuit and an inductive device to convert an input voltage to an output voltage, the pulse frequency modulation control circuit comprising:
a current sensing circuit for generating a current detection signal representative of a current flowing through the inductive device;
a voltage sensing circuit for generating a voltage detection signal representative of the output voltage; and
a pulse generating circuit for generating a pulse control signal in response to the current detection signal and the voltage detection signal, the pulse control signal having a plurality of switch cycles, each of which consists of an ON-time applied to turn on the switching circuit and an OFF-time applied to turn off the switching circuit,
wherein:
the ON-time is adjusted in accordance with the current detection signal such that the ON-time is prolonged in response to an increase of a maximum of the current detection signal, and
the OFF-time is adjusted in accordance with the voltage detection signal such that the OFF-time is prolonged in response to a reduction of a falling rate of the voltage detection signal
wherein:
the pulse generating circuit comprises:
a reference ON-time setting circuit for preventing the ON-time from being shorter than a predetermined reference ON-time, and
an ON-time adjusting circuit for dynamically adjusting the ON-time in accordance with the current detection signal,
wherein:
the reference ON-time setting circuit comprises:
a current source;
a capacitor connected between the current source and a ground potential;
a switch controlled by the pulse control signal such that the switch is turned off during the ON-time for allowing the current source to charge the capacitor, and the switch is turned on during the OFF-time for allowing the capacitor to be discharged to the ground potential; and
a comparator for comparing a potential difference across the capacitor and a predetermined reference voltage.

2. The circuit according to claim 1, wherein:
the ON-time during a present switch cycle is dynamically adjusted in accordance with the maximum of the current detection signal during a previous switch cycle.

3. The circuit according to claim 1 wherein:
the ON-time adjusting circuit comprises:
a sample-and-hold circuit for sampling and holding the maximum of the current detection signal, and
a variable current source controlled by the maximum of the current detection signal held on the sample-and-hold circuit for discharging the capacitor when the current source of the reference ON-time setting circuit charges the capacitor.

4. The circuit according to claim 3, wherein:
the sample-and-hold circuit comprises:
a sampling capacitor;
a sampling transmission gate to be turned on during the ON-time for allowing the current detection signal to charge the sampling capacitor;
a holding capacitor; and
a holding transmission gate to be turned on during the OFF-time for allowing a potential difference across the sampling capacitor to be transferred to the holding capacitor.

5. The circuit according to claim 1, wherein:
the pulse generating circuit further comprises:
a reference OFF-time setting circuit for preventing the OFF-time from being shorter than a predetermined reference OFF-time, and
an OFF-time adjusting circuit for dynamically adjusting the OFF-time in accordance with the voltage detection signal.

6. The circuit according to claim 5, wherein:
the reference OFF-time setting circuit comprises:
a current source;
a capacitor connected between the current source and a ground potential;
a switch controlled by the pulse control signal such that the switch is turned on during the ON-time for allowing the capacitor to be discharged to the ground potential, and the switch is turned off during the OFF-time for allowing the current source to charge the capacitor; and
a comparator for comparing a potential difference across the capacitor and a predetermined reference voltage.

7. The circuit according to claim 5, wherein:
the OFF-time adjusting circuit is implemented by a comparator for comparing the voltage detection signal and a predetermined reference voltage so as to prevent the OFF-time from being finished before the voltage detection signal falls below the reference voltage.

8. A pulse frequency modulation control circuit for controlling a switching regulator having a switching circuit and an inductive device to convert an input voltage to an output voltage, the pulse frequency modulation control circuit comprising:
a current sensing circuit for generating a current detection signal representative of a current flowing through the inductive device;
a voltage sensing circuit for generating a voltage detection signal representative of the output voltage; and
a pulse generating circuit for generating a pulse control signal in response to the current detection signal and the voltage detection signal, the pulse control signal having a plurality of switch cycles, each of which consists of an ON-time applied to turn on the switching circuit and an OFF-time applied to turn off the switching circuit,
wherein:
the ON-time is adjusted in accordance with the current detection signal such that the ON-time is longer in a heavy loading operation than in a light loading operation, and the OFF-time is adjusted in accordance with the voltage detection signal such that the OFF-time is longer in the light loading operation than in the heavy loading operations,
wherein:
the pulse generating circuit comprises:
a reference ON-time setting circuit for preventing the ON-time from being shorter than a predetermined reference ON-time, and an ON-time adjusting circuit for dynamically adjusting the ON-time in accordance with the current detection signal, wherein: the reference ON-time setting circuit comprises:

a current source;

a capacitor connected between the current source and a ground potential;

a switch controlled by the pulse control signal such that the switch is turned off during the ON-time for allowing the current source to charge the capacitor. and the switch is turned on during the OFF-time for allowing the capacitor to be discharged to the ground potential; and a comparator for comparing a potential difference across the capacitor and a predetermined reference voltage.

9. The circuit according to claim 8, wherein:

the ON-time during a present switch cycle is dynamically adjusted in accordance with a maximum of the current detection signal during a previous switch cycle.

10. The circuit according to claim 8, wherein:

the ON-time adjusting circuit comprises:

a sample-and-hold circuit for sampling and holding a maximum of the current detection signal, and a variable current source controlled by the maximum of the current detection signal held on the sample-and-hold circuit for discharging the capacitor when the current source of the reference ON-time setting circuit charges the capacitor.

\* \* \* \* \*

UNITED STATES PATENT AND TRADEMARK OFFICE
CERTIFICATE OF CORRECTION

PATENT NO. : 7,279,869 B2  Page 1 of 1
APPLICATION NO. : 10/908303
DATED : October 9, 2007
INVENTOR(S) : Guang-Nan Tzeng et al.

It is certified that error appears in the above-identified patent and that said Letters Patent is hereby corrected as shown below:

On the Title Page, Item (54), Title of the Invention,

"PFM CONTROL CIRCUIT FOR DC REGULATOR" should be corrected to
-- PFM CONTROL CIRCUIT FOR CONVERTING VOLTAGES WITH HIGH EFFICIENCY OVER BROAD LOADING REQUIREMENTS --

Signed and Sealed this

Twenty-fifth Day of December, 2007

JON W. DUDAS
*Director of the United States Patent and Trademark Office*